(12) United States Patent
Dubin

(10) Patent No.: US 7,122,461 B2
(45) Date of Patent: Oct. 17, 2006

(54) METHOD TO ASSEMBLE STRUCTURES FROM NANO-MATERIALS

(75) Inventor: Valery M. Dubin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/056,322

(22) Filed: Feb. 10, 2005

(65) Prior Publication Data

US 2006/0177946 A1  Aug. 10, 2006

(51) Int. Cl.
 *H01L 21/4763* (2006.01)
(52) U.S. Cl. .................................... 438/618; 977/788
(58) Field of Classification Search .................. 438/1, 438/3, 6, 48, 52, 364, 672, 745, 780, 800, 438/149, 618, 427; 977/788
See application file for complete search history.

(56) References Cited

U.S. PATENT DOCUMENTS

| | | | |
|---|---|---|---|
| 2005/0045867 A1* | 3/2005 | Ozkan et al. | 257/12 |
| 2005/0056828 A1* | 3/2005 | Wada et al. | 257/40 |
| 2005/0136483 A1* | 6/2005 | Carlson | 435/7.1 |
| 2005/0164432 A1* | 7/2005 | Lieber et al. | 438/149 |

* cited by examiner

*Primary Examiner*—Michael Lebentritt
*Assistant Examiner*—Andre' Stevenson
(74) *Attorney, Agent, or Firm*—Blakely, Sokoloff, Taylor & Zafman LLP

(57) ABSTRACT

Numerous embodiments of a method to assemble nano-materials on a platform are described. In one embodiment, a nano-material is functionalized with a first bondable group. The functionalized nano-material is disposed on an assembly platform having an electrode to form a first layer. Additional layers of the nano-material may be formed above the first layer to form a semiconductor device. In one embodiment, the nano-material may be a carbon nanotube.

24 Claims, 11 Drawing Sheets

Carbon Nanotube

METHOD TO ASSEMBLE STRUCTURES FROM NANO-MATERIALS

FIELD

Embodiments of the present invention relate to the field of semiconductor manufacturing, and more specifically, to methods for the assembly semiconductor devices from nano-materials.

BACKGROUND

The shrinking dimensions of active devices on silicon chips are approaching its limit due to restrictions set by photolithographic techniques. For example, wave properties of radiation, such as interference and diffraction, can limit device size and density. Considerable research has taken place to overcome the limitations of photolithographic techniques.

Carbon-based nano-materials are considered one type of alternative materials for manufacturing active devices. One example of a nano-material is carbon nanotubes, which are tubular carbon molecules with properties that make them potentially useful in extremely small scale electronic and mechanical applications. They exhibit high strength and advantageous electrical properties, and are extremely efficient conductors of heat. Also, because of their unique dimensions and unusual current conduction mechanism, carbon nanotubes may be ideal components of electrical circuits, transistors, MEMS devices, interconnects, and other circuit elements. FIG. 1 illustrates a carbon nanotube 100 having carbon atoms along the surface of the cylindrical shape and a hemispherical shape in its end portions. The carbon nanotube 100 has a metallic or semiconductor property depending on the number of carbon atoms constituting the cylindrical shape and the coupling direction of them.

One problem with using nano-materials such as carbon nanotubes in circuits relates to fabrication difficulties. The carbon nanotube production processes are very different from the traditional integrated circuit (IC) fabrication process in that a conventional top-to-bottom approach is not used (e.g., films are deposited onto a wafer and pattern-etched away). Today, there is no reliable way to arrange carbon nanotubes into a circuit. In one currect fabrication method, carbon nanotubes are manipulated one-by-one with the tip of an atomic force microscope in a painstaking, time-consuming process.

BRIEF DESCRIPTION OF THE DRAWINGS

Embodiments of the present invention are illustrated by way of example, and not limitation, in the figures of the accompanying drawings in which.

DETAILED DESCRIPTION

In the following description, numerous specific details are set forth such as examples of specific materials or components in order to provide a thorough understanding of embodiments of the present invention. It will be apparent, however, to one skilled in the art that these specific details need not be employed to practice embodiments of the present invention. In other instances, well known components, methods, semiconductor equipment and processes have not been described in detail in order to avoid unnecessarily obscuring embodiments of the present invention.

The terms "on," "above," "below," "between," and "adjacent" as used herein refer to a relative position of one layer or element with respect to other layers or elements. As such, a first element disposed on, above or below another element may be directly in contact with the first element or may have one or more intervening elements. Moreover, one element disposed next to or adjacent another element may be directly in contact with the first element or may have one or more intervening elements.

Any reference in the specification to "one embodiment" or "an embodiment" means that a particular feature, structure, or characteristic described in connection with the embodiment is included in at least one embodiment of the claimed subject matter. The appearances of the phrase, "in one embodiment" in various places in the specification are not necessarily all referring to the same embodiment.

Embodiments of a method to assemble semiconductor devices or structures using nano-materials are described. In one embodiment of the present invention, two-dimensional or three-dimensional devices for use in semiconductor devices may be assembled from nano-materials such as carbon nanotubes, silicon nano-wires, metal nano-wires, or quantum dots. The nano-materials may be assembled on a platform to provide a bottom-to-top assembly method. Embodiments of the method described herein provide the advantage controlling the formation of a desired semiconductor structure, for example, an interconnect for coupling microchips disposed on a substrate, or any portion of a semiconductor device that is typically made of silicon.

Figure 1:
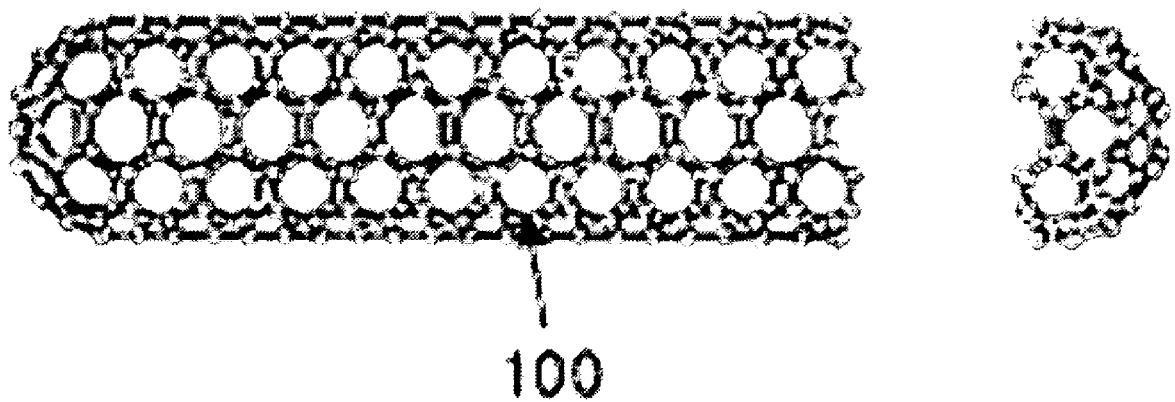
FIG. 1 illustrates a carbon nanotube.
Figure 2:
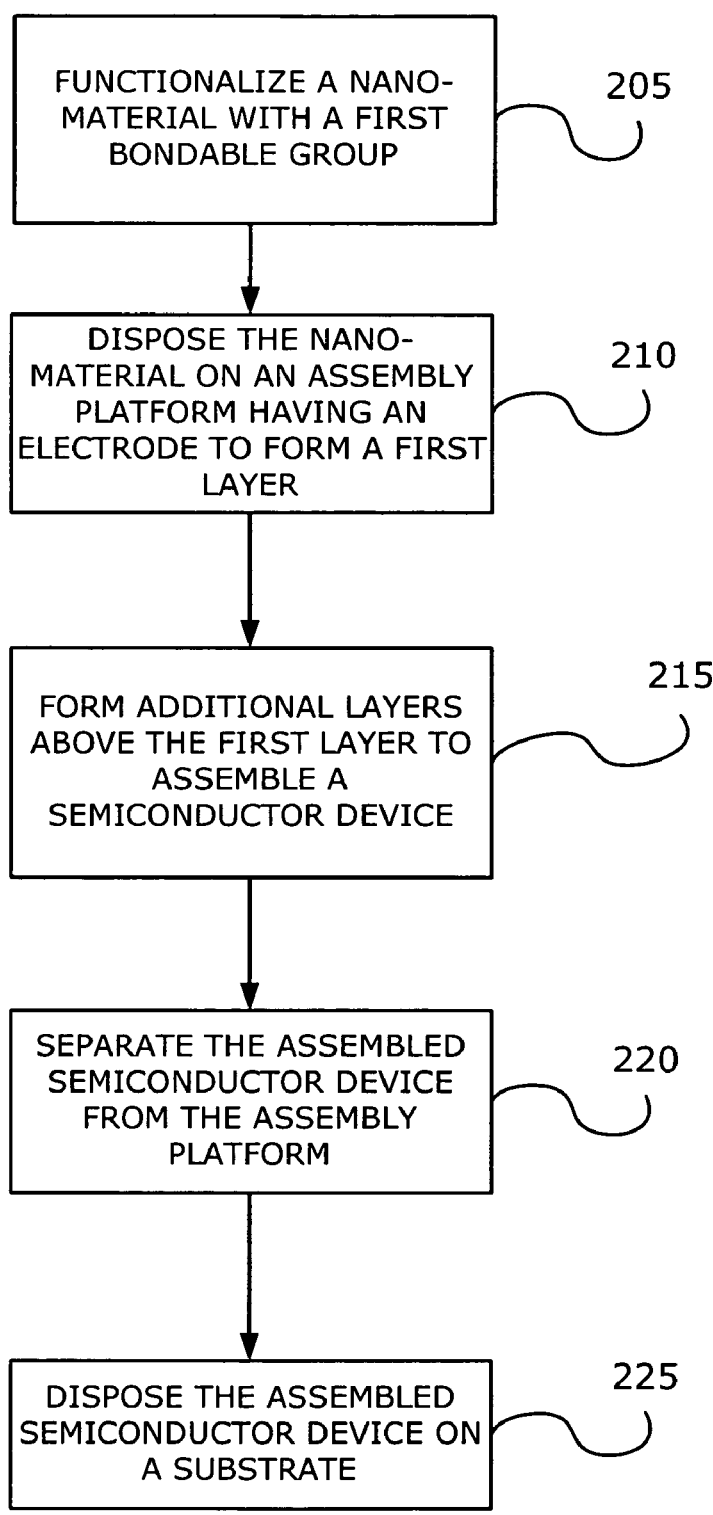
FIG. 2 illustrates a block diagram of one general method to assemble a semiconductor device from nano-materials.

FIG. 2 illustrates a block diagram 200 of one general method to assemble a semiconductor device from nano-materials. The nano-materials may be nanotubes, silicon nanowires, metal nanowires, quantum dots, any other type of nano-materials that serve as the building blocks or structural elements for the semiconductor device. The nano-materials may be formed by any one of the methods known in the art, for example, by chemical vapor deposition (CVD) to form carbon nanotubes. The nano-materials are then functionalized to form a bondable group that is attached to the nano-material, block 205. In one embodiment, the nano-materials may be functionalized with one or more deoxyribose nucleic acid (DNA) groups. In alternative embodiments, the nano-materials may be functionalized with other types of bondable groups. The functionalized nano-materials may then be disposed on an assembly platform having an electrode to form a first layer of nano-materials, block 210. In one embodiment, the electrode may be functionalized with another bondable group that is compatible or complementary to the bondable group of the nano-material. For example, first layer on the platform may be formed by the hybridization of the bondable group on the nano-material to the bondable group on the electrode. In one embodiment, the platform may include an array of electrodes functionalized with bondable groups.

After the first layer of the nano-material is formed on the platform, additional layers of the nano-material may be formed above the first layer, block 215. In one embodiment, the additional layers are formed by coupling other nano-materials that have been functionalized with bondable groups in a manner similar to the nano-material used to form the first layer. That is, bondable groups are formed on other nano-materials to couple to a free bondable group on the first layer. Any number of layers may be formed over the first layer until the desired structure or device is assembled. In one embodiment, a voltage may be applied to the electrode to coupled additional layers of nano-materials selectively. The assembled structure may then be separated from the platform, block 220. In one embodiment, the assembled structure may be separated from the platform by applying a potential to the electrode. The detached assembled structure may then be disposed on a substrate (e.g., a wafer) for use as a semiconductor device or component, block 225. For example, in one embodiment, the assembled structure may be an electrical interconnect for an array of microchips disposed on a substrate.

Figure 3:
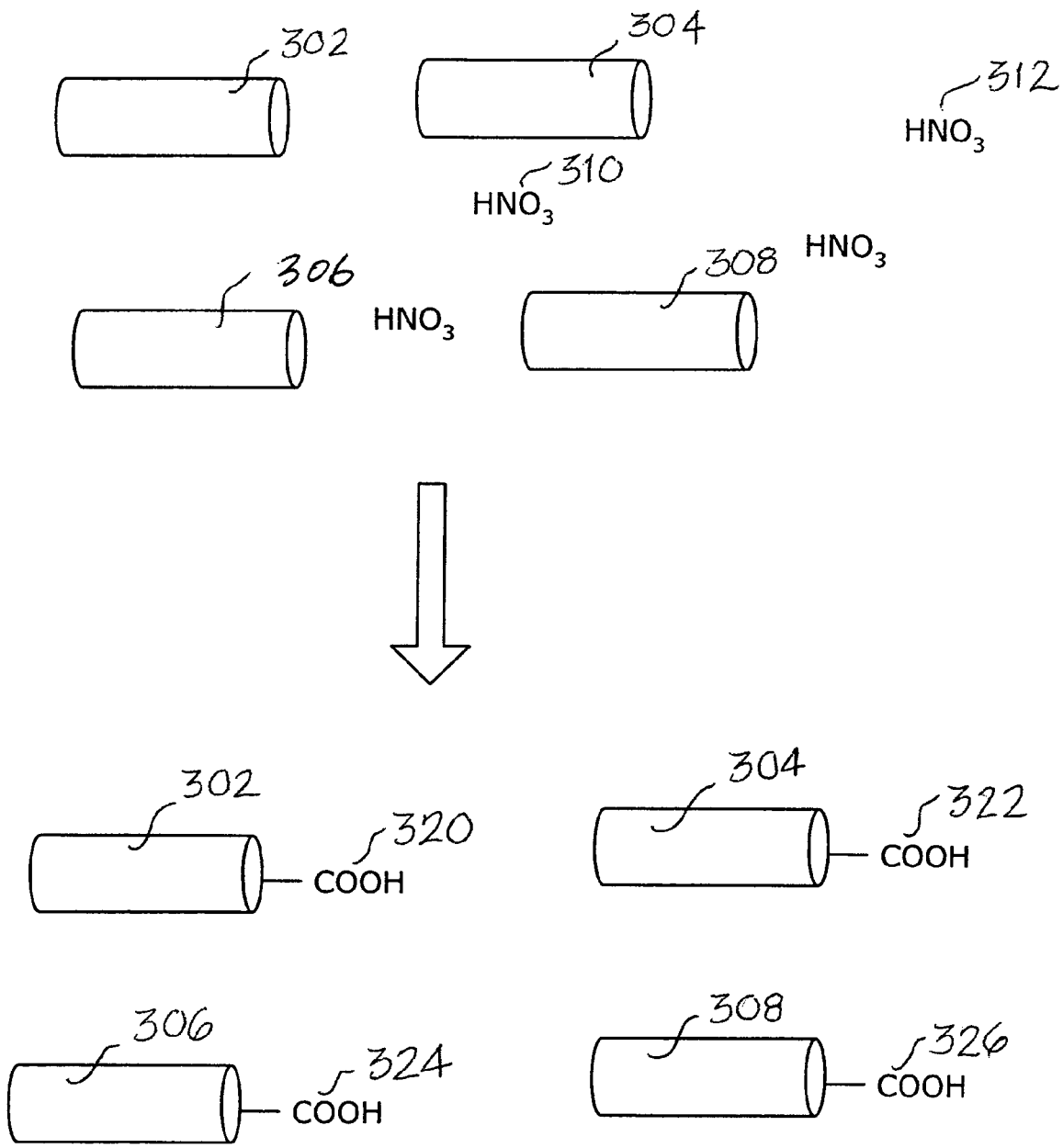
FIG. 3 illustrates the functionalization of multiple carbon nanotubes.

FIGS. 3–8 illustrate in greater detail one embodiment of assembling nano-materials on a platform. Although FIGS. 3–8 are described with respect to the use of carbon nanotubes as the structural elements or building blocks for assembly, it may be appreciated that other types of nano-materials (e.g., silicon nanowires, metal nanowires) may be substituted for carbon nanotubes. FIG. 3 illustrates the functionalization of multiple carbon nanotubes (e.g., 302, 304, 306, and 308) for use as the structural elements in the assembly of a device. The carbon nanotubes may be prepared by any method known in the art, including but not limited to, carbon arc processing, pulsed laser vaporization, chemical vapor deposition, and high-pressure carbon monoxide conversion. In one particular embodiment, the carbon nanotubes 302, 304, 306, and 308 may be formed by heating a catalyst material (e.g., CoMo, FeMo) to high temperatures in a tube furnace and flowing hydrocarbon gas through a tube reactor. Other types of catalysts that may be used to grow the carbon nanotubes include cobalt, iron, rhodium platinum, nickel yttrium, or any combination thereof. The carbon nanotubes are grown over the catalyst and collected when the tube reactor is cooled. Other embodiments may use different methods to grow the carbon nanotubes, such as discharge between carbon electrodes, thermal decomposition of hydrocarbons such as acetylene, methane, and ethane, and plasma enhanced chemical vapor deposition. These methods may be used to form carbon nanotubes of varying lengths and other dimensional characteristics. In one embodiment, the carbon nanotubes may have a length between about 1 to about 10 microns, and a diameter between about 10 to about 1000 angstroms. The carbon nanotubes may also be single-walled or multi-walled.

As illustrated in FIG. 3, the functionalization of carbon nanotubes 302, 304, 306, and 308 involves a reaction with a strong acid such as nitric acid (e.g., 310, 312) to form COOH groups coupled to the one or more ends of the carbon nanotubes. Because carbon nanotubes typically have enclosed ends, a strong acid is used to break the carbon—carbon bonds and form the COOH group. In one embodiment, the reaction of the carbon nanotubes with nitric acid may be thermally or electrically driven to form the COOH group at the end(s) of the carbon nanotubes (e.g., 320, 322, 324, and 326). In an alternative embodiment, the reaction may be controlled by a certain pH range to form the COOH groups at the ends of the carbon nanotubes. Other types of acids that may be used include sulfuric acid ($H_2SO_4$) and hydrochloric acid (HCl).

Figure 4:
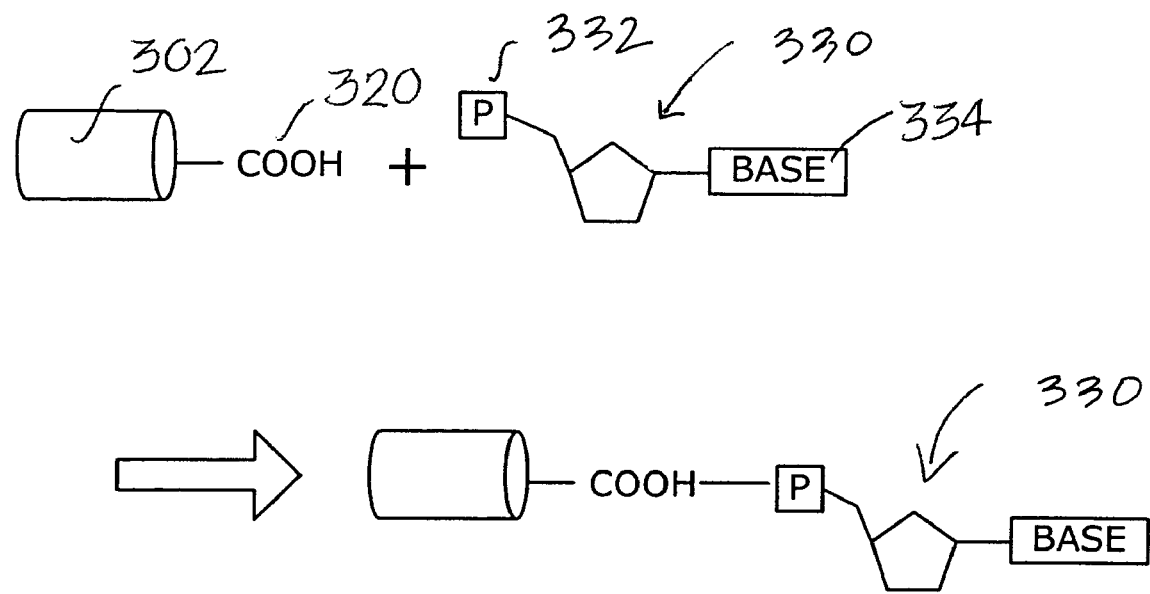
FIG. 4 illustrates the functionalization of carbon nanotubes with DNA.
Figure 5:
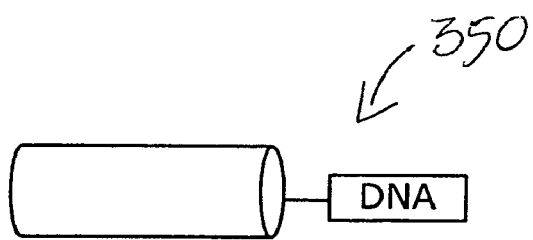
FIG. 5 illustrates a general representation of a DNA functionalized carbon nanotube.

As illustrated in FIG. 4, the functionalization of the carbon nanotubes (e.g., carbon nanotubes 302 with COOH group 320) further involves coupling a DNA 330. In particular, the phosphate group 332 couples to COOH group 320 to form the functionalized carbon nanotubes structure 340. Base 334 of DNA 330 is generically represented. Although DNA 330 is represented as a single unit, in alternative embodiments, any size or segment length of a DNA chain may be coupled to COOH group 320. A DNA functionalized carbon nanotube 350 is generically illustrated in FIG. 5.

Figure 6:
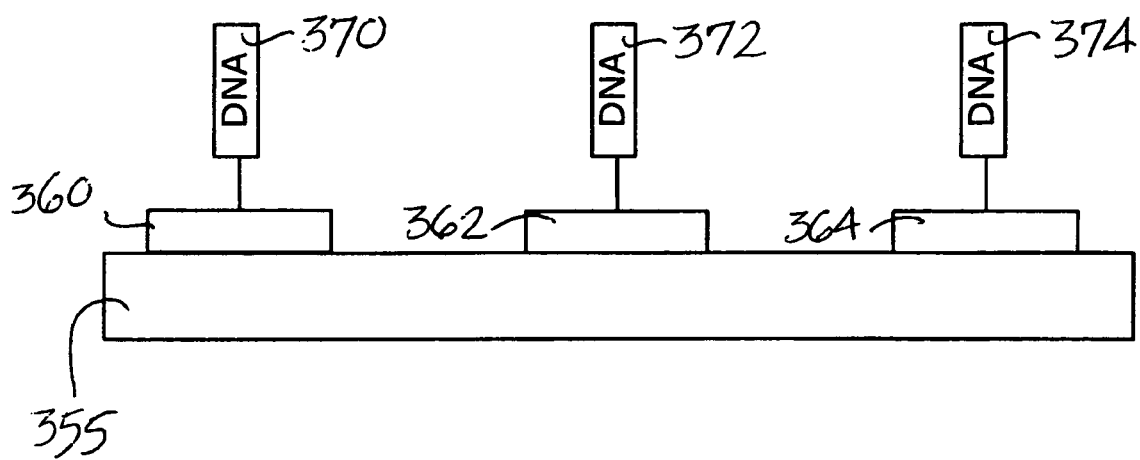
FIG. 6 illustrates a structure for the assembly of the functionalized carbon nanotubes that includes one or more electrodes.
Figure 7:
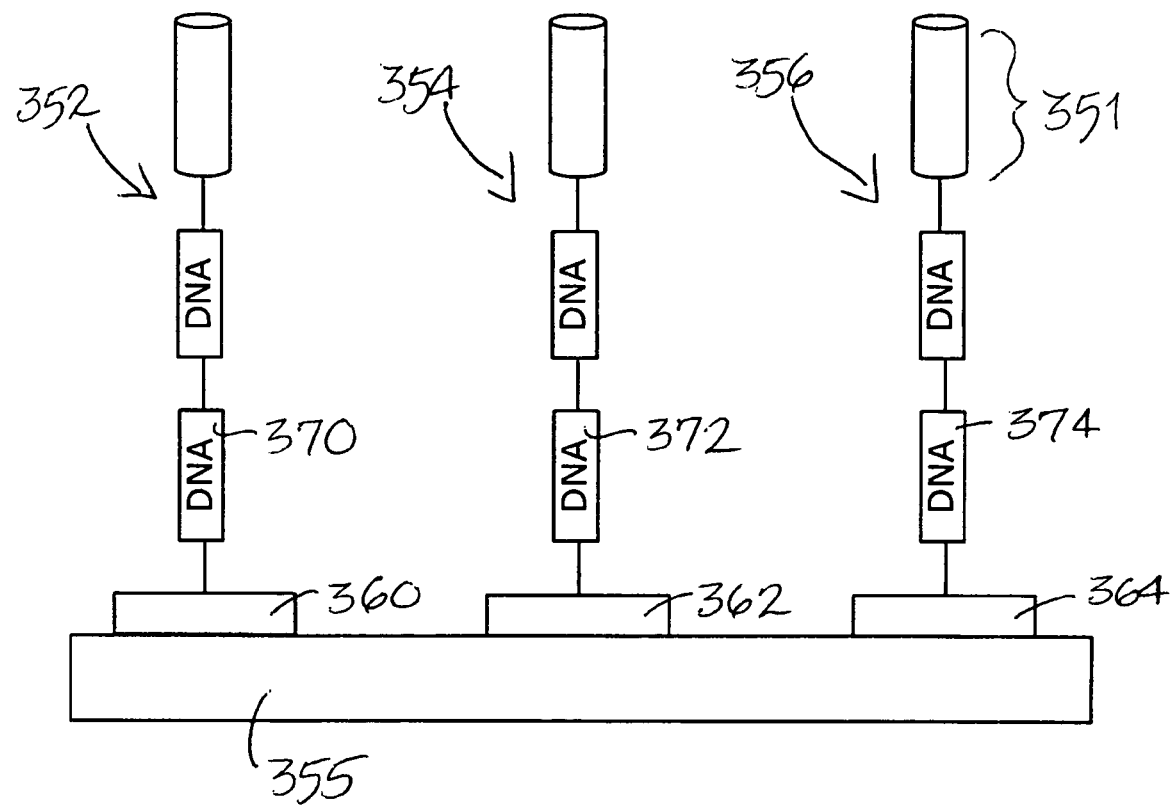
FIG. 7 illustrates the functionalized carbon nanotubes coupled to one or more of the electrodes through the hybridization of the DNA groups.

FIG. 6 illustrates a structure for the assembly of the functionalized carbon nanotubes that includes one or more electrodes 360, 362, 364 or nano-electrodes disposed on a surface of platform 355. Platform 355 may be any type of substrate for supporting an electrode array. In one embodiment, platform 355 may be a semiconductor substrate. DNA segments may be synthesized on electrodes 360, 362, 364 and functionalized as shown. For example, DNA group 370 may be functionalized on electrode 360, DNA group 372 may be functionalized electrode 362, and DNA group 374 may be functionalized on electrode 364. In one embodiment, an electrode array may be made individually addressable by applying a potential or voltage to a particular electrode. Next, as illustrated in FIG. 7, the functionalized carbon nanotubes may be coupled to one or more of the electrodes through the hybridization of the DNA groups. The DNA group from carbon nanotube 352 is coupled to electrode 360, carbon nanotube 354 is coupled to electrode 362, and carbon nanotube 356 is coupled to electrode 364. The coupling of the carbon nanotubes to the electrode array forms a first layer 351 of carbon nanotubes. In one embodiment, the hybridization of the DNA groups may involve the bonding of complimentary base pairs from the carbon nanotube and an electrode (e.g., carbon nanotube 352 to electrode 360). For example, the pairing may involve adenine bonding to thymine or the pairing of guanine to cytosine. As discussed above, the coupling of a carbon nanotube to an electrode may be controlled or individualized by making each electrode electrically addressable.

Figure 8:
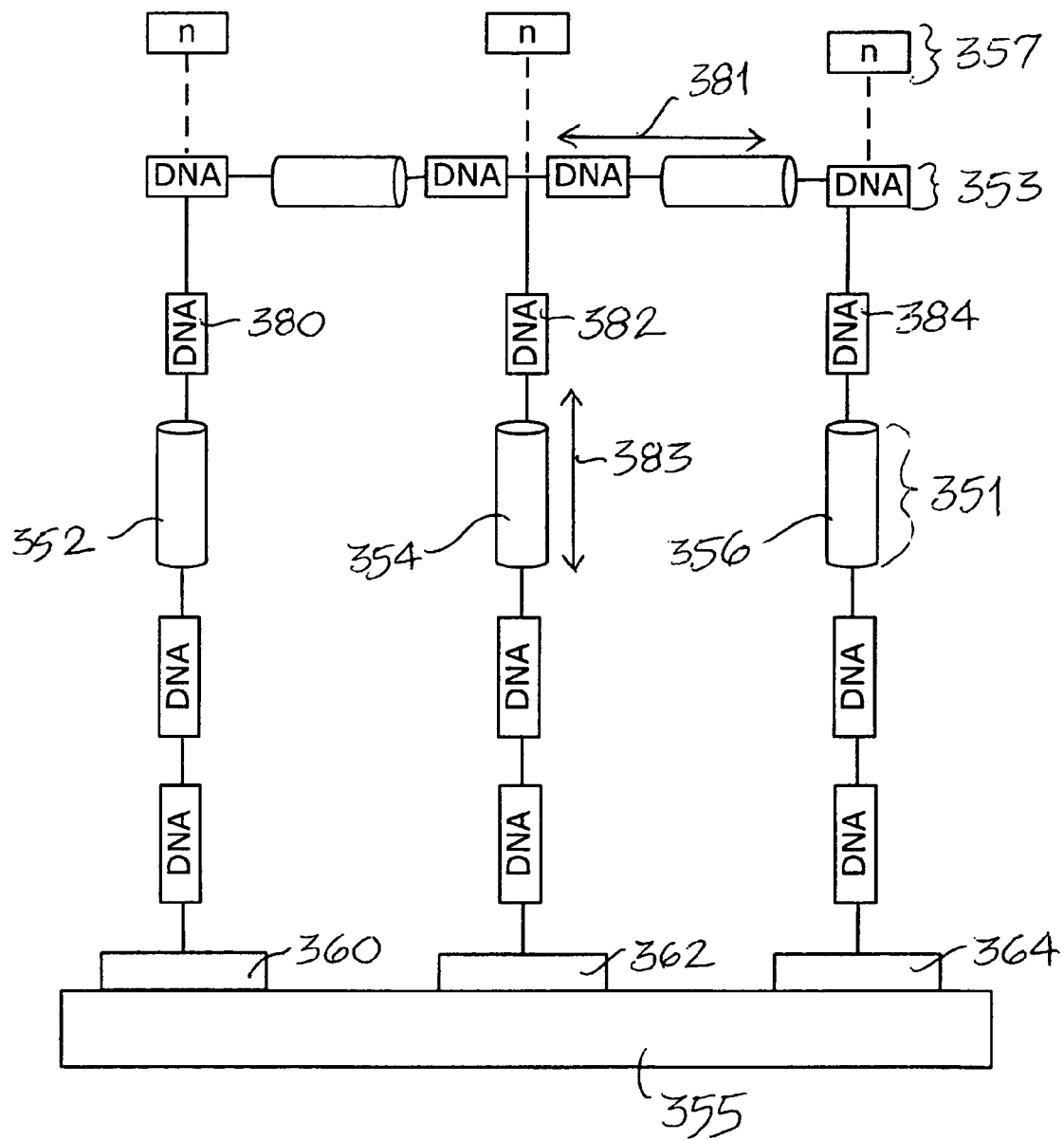
FIG. 8 illustrates the formation of additional layers of carbon nanotubes disposed above and coupled to a first layer.

FIG. 8 illustrates the formation of additional layers of carbon nanotubes disposed above and coupled to first layer 351. For example, a second layer 353 of carbon nanotubes is disposed above first layer 351. In one embodiment, second layer 353 is formed by functionalizing an exposed or second end of the carbon nanotubes forming first layer 351 DNA (e.g., DNA groups 380, 382, and 384). Additional carbon nanotubes (that has also be functionalized) may then be coupled to first layer 351 through a hybridization reaction of the DNA groups as described above. In one embodiment, the relative orientations of the carbon nanotubes may be controlled by reacting carbon nanotubes of varying length. For example, carbon nanotubes for second layer 353 are horizontal relative to the carbon nanotubes of first layer 351. By making a length 383 of a carbon nanotube (e.g., 354) forming first layer 351 longer than a length 381 of a carbon nanotube forming second layer 353, the carbon nanotubes of second layer 353 bond horizontally relative to the carbon nanotubes of first layer 351. Any number of additional carbon nanotube layers (represented by layer 357) may be disposed above platform 355 by repeating the functionalization process for other carbon nanotubes until the desired structure is assembled.

Figure 9:
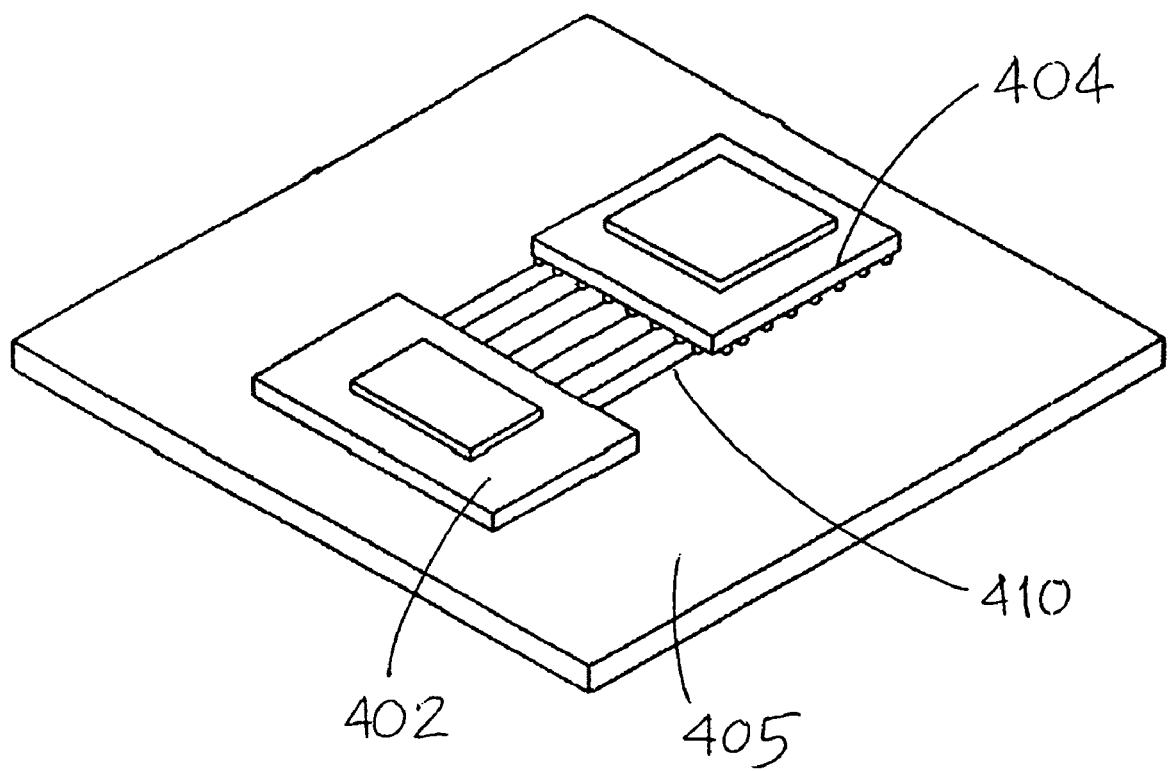
FIG. 9 illustrates one embodiment of a substrate having one or more microchip packages.

The assembled structure may then be detached from platform 355. In one embodiment, a potential may be applied to electrodes 360, 362, 364 to detach the assembled carbon nanotube structure. In one particular embodiment, a potential between about 1 volt to about 2 volts may be applied to the electrodes. The assembled structure may then be disposed on a substrate by functionalizing connections points on the substrate. FIG. 9 illustrates one embodiment of a substrate 405 (e.g., a motherboard) having one or more microchip packages 402 and 404 (e.g., a processor or CPU). One or more interconnects 410 allow for the connectivity of the package 402 with package 404. In one embodiment, interconnect 410 may be formed or assembled with nano-materials described above with respect to FIGS. 3–8.

Figure 10:
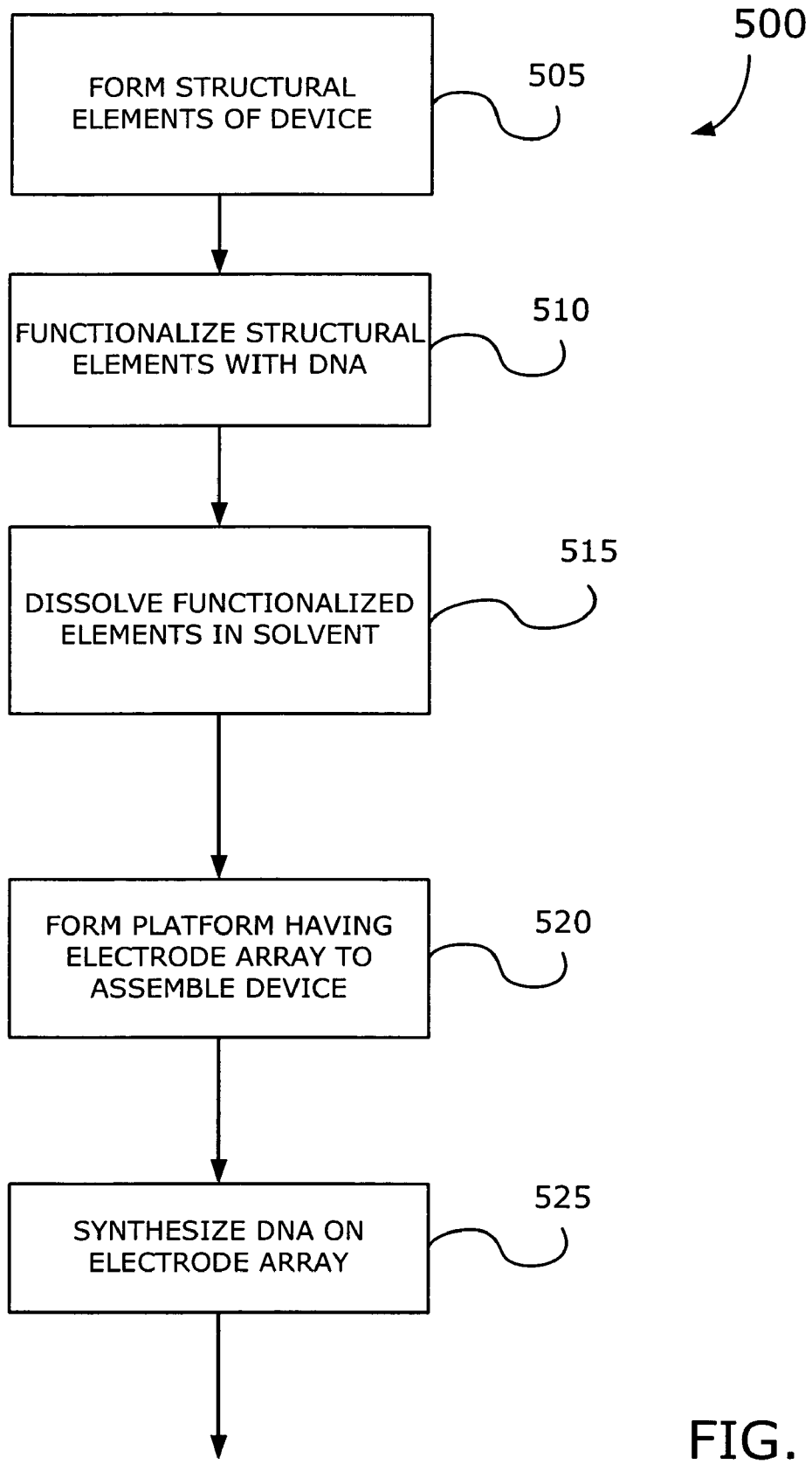
FIG. 10 illustrates a block diagram of an alternative method to assemble a semiconductor device or structure using structural elements developed on a platform.
Figure 10:
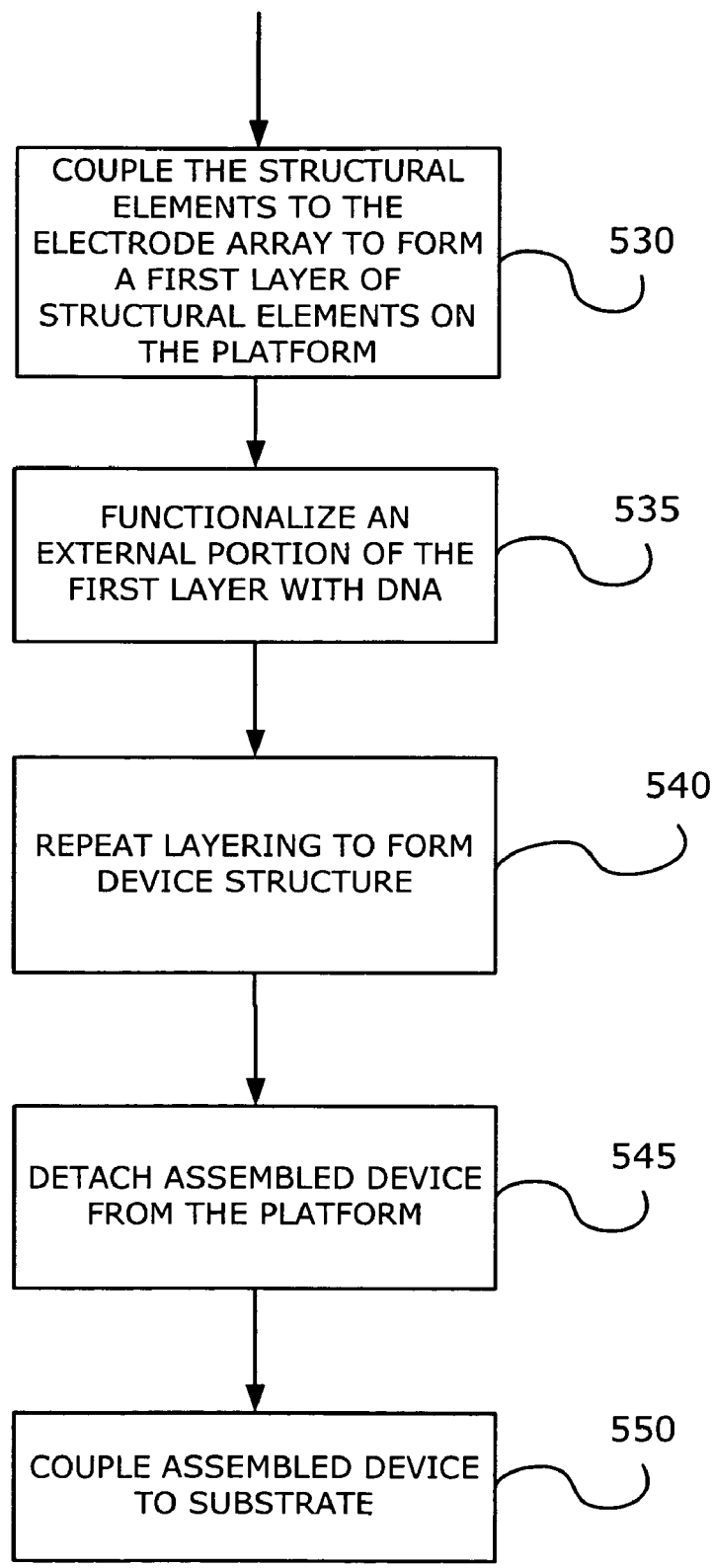

FIG. 10 illustrates a block diagram 500 of an alternative method to assemble a semiconductor device or structure using structural elements developed on a platform. The structural elements or building blocks of the device are initially formed, block 505. In one embodiment, the structural elements may be nano-materials for the assembly of semiconductor devices such as interconnects, transistors, or other circuit elements. The nano-materials may include carbon nanotubes, silicon nanowires, metal nanowires, silicon quantum dots, gold quantum dots, or any other types of nano-materials known in the art. Standard methods may be used to prepare nano-materials such chemical vapor deposition to fabricate carbon nanotubes, chemical vapor deposition fabrication of silicon nano-wires on gold catalysts, or silver nano-wire fabrication by $AgNO_3$ reduction with ethylene glycol. The structural elements are then functionalized with DNA, block 510. In one embodiment, functionalization of the structural element may be achieved by a first reaction with an acid such as nitric acid, sulfuric acid, or hydrochloric acid to form a COOH group coupled to the structural element (e.g., group 320 coupled to carbon nanotube 302). The phosphate group from a DNA segment (e.g., from a single DNA or a single stranded DNA segment) may then be coupled to the COOH group of the structural element (e.g., structure 340). The functionalized structural elements may then be dissolved in a solvent, block 515. In one embodiment, the solvent may be water, an alcohol, or a glycol. In alternative embodiments, other solvents known in the art may be used to dissolve the functionalized structural elements.

Before, during, or after the functionalization of the structural elements, a platform (e.g., platform 355) having an electrode array (e.g., electrodes 360, 362) may be formed, block 520. The platform and electrode array may be used for the building of the semiconductor device with the functionalized structural elements. In one embodiment, the platform may be a semiconductor substrate. In an alternative embodiment, the electrode array may include individually addressable nano-electrodes. Alternatively, electrical interconnects or logic/memory integrated circuits may be disposed on the platform. DNA groups may then be synthesized on the electrode array, block 525. That is, the electrode array may be functionalized with a DNA segment. In one embodiment, a single-stranded DNA segment may be synthesized on a gold electrode array. The functionalized structural elements may then be coupled to the electrode array to form a first layer of structural elements on the platform, block 530. In one embodiment, coupling of the structural elements to the electrode array may be accomplished by a hybridization reaction of complementary DNA bonding pairs. The selectivity of an electrode for coupling to a structural element may be controlled by applying different potentials to the electrode array.

An external portion of the structural element that is not coupled to the electrode array (e.g., a second end of a carbon nanotube) may then be functionalized with DNA, block 535. That is, a top surface portion of the first layer is functionalized for further coupling to other structural elements. In one embodiment, the structural elements may be functionalized with DNA in a manner described above with respect to block 510. The layering of structural elements may be repeated until the desired device is assembled, block 540. The orientation and coupling of structural elements may be controlled by applying different potentials to the electrode array as well as varying the length of the structural elements (e.g., using carbon nanotubes of varying length). The assembled device is then detached from the platform, block 545. In one embodiment, the detachment may be accomplished by applying a potential sufficient enough to cause the structural elements to detach from the electrode array. The assembled device may then be coupled or disposed on a substrate for use as part of a semiconductor device, circuit element, or interconnect, block 550. In one embodiment, the assembled device may be used as an electrical interconnect for multiple microchip packages (e.g., interconnect 410). The interconnect assembly may be metallized by an electroless plating method or any other plating method known in the art.

Figure 11:
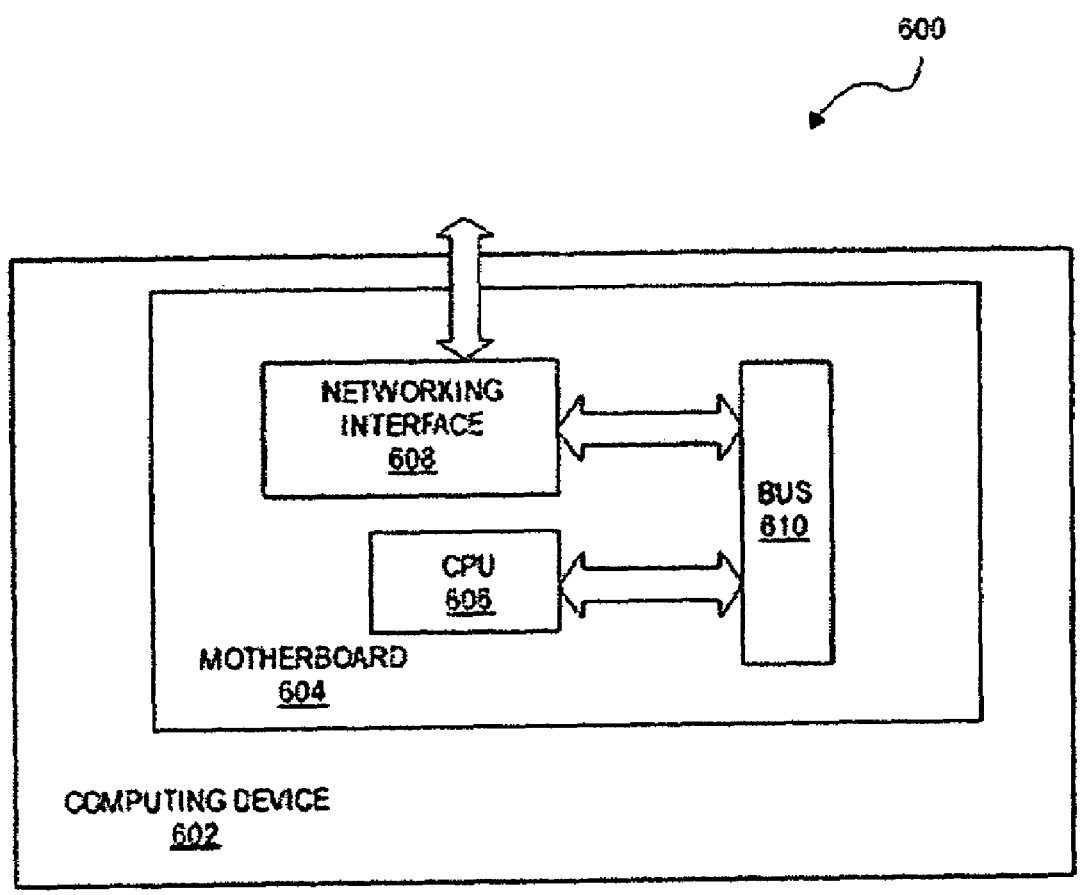
FIG. 11 illustrates a system in accordance with one embodiment having structures or components formed by the methods described herein.

FIG. 11 illustrates a system 600 in accordance with one embodiment having structures or components formed by the methods described herein. As illustrated, for the embodiment, system 600 includes computing device 602 for processing data. Computing device 602 may include a motherboard 604. Motherboard 604 may include in particular a processor 606, and a networking interface 608 coupled to a bus 610. More specifically, processor 606 may comprise interconnects, transistors, or other circuit elements that have been formed by the earlier described methods using nano-materials.

In the foregoing specification, the invention is described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
    functionalizing a plurality of nano-materials with a first set of bondable groups;
    functionalizing an array of individually addressable electrodes on an assembly platform with a second set of bondable groups;
    disposing the plurality of nano-materials concurrently on the assembly platform having the functionalized electrode array to form a first layer;
    forming additional layers above the first layer to form a semiconductor device;

detaching the semiconductor device from the assembly platform; and disposing the detached semiconductor device on a substrate.

2. The method of claim 1, wherein functionalizing the nano-materials further comprises coupling a COOH group with a DNA to form a bondable group included in the first set of bondable groups.

3. The method of claim 1, wherein functionalizing the nano-materials further comprises coupling a COOH group with a peptide to form a bondable group included in the first set of bondable groups.

4. The method of claim 1, wherein disposing the nano-materials on the assembly platform further comprises coupling the first set of bondable groups with a second set of bondable groups disposed on the electrode array.

5. The method of claim 4, wherein the first and second set of bondable groups comprise complementary DNA and wherein coupling further comprises hybridizing the first and second bondable groups.

6. The method of claim 5, wherein forming further comprises selectively functionalizing and coupling nano-materials to the semiconductor device being formed by applying different electrical potentials to individually addressable electrodes.

7. The method of claim 1, further comprises plating the semiconductor device.

8. A method to assemble a semiconductor device, comprising:

functionalizing nano-materials with DNA groups, wherein the nano-materials comprise building blocks for the semiconductor device;

synthesizing DNA on an array of individually addressable nano-electrodes disposed on the surface of a platform to receive the nano-materials;

coupling the nano-materials to the electrode array to form a first layer of nano-materials; and forming additional layers of nano-materials above the first layer until the semiconductor device is assembled;

wherein forming further comprises selectively functionalizing and coupling specific nano-materials to the semiconductor device being formed by applying different electrical potentials to individually addressable electrodes and by providing nano-materials of varied lengths and dimensions.

9. The method of claim 8, wherein functionalizing comprises reacting the structural elements with an acid.

10. The method of claim 8, wherein coupling further comprises selectively applying a first voltage to the individually addressable electrode array to bond the nano-materials to the electrode array.

11. The method of claim 8, wherein the nano-materials comprise carbon nanotubes.

12. The method of claim 8, wherein the nano-materials are selected from the group consisting of: nanowires, carbon nanotubes, silicon nanowires, metal nanowires, quantum dots, and any combination thereof.

13. The method of claim 8, further comprising:

detaching the semiconductor device from the platform; and depositing the detached semiconductor device on a substrate.

14. A method to assemble an interconnect, comprising:

functionalizing a first end and a second end of a first set of carbon nanotubes with a first set of DNA segments;

providing a platform having an individually addressable array of nano-electrodes, the electrodes having a surface with a second set of DNA segments that are complementary to the first set of DNA segments;

applying voltages to the electrodes to couple the first end of the carbon nanotubes with the electrodes to form a first layer selectively;

coupling a second set of carbon nanotubes having a third set of DNA segments to the second end of the first set of carbon nanotubes to form a second layer;

wherein coupling comprises selectively coupling specific nano-materials to the semiconductor device being formed by applying different electrical potentials to individually addressable electrodes and by providing nano-materials of varied lengths and dimensions;

repeating a coupling of additional sets of carbon nanotubes to the first and second sets of carbon nanotubes until the interconnect is formed on the platform;

detaching the interconnect from the platform;

disposing the detached interconnect on a substrate; and plating the interconnect.

15. The method of claim 14, wherein functionalizing further comprises forming a COOH group on the first set of carbon nanotubes that is coupled to a phosphate group of the first set of DNA segments.

16. The method of claim 15, wherein providing the platform further comprises functionalizing the electrodes with the second set of DNA segments.

17. The method of claim 16, wherein applying a voltage further comprises hybridizing the first DNA segment with the second DNA segment.

18. The method of claim 17, wherein coupling the second set of carbon nanotubes further comprises functionalizing the second end of the first set of carbon nanotubes with DNA.

19. The method of claim 18, wherein detaching further comprises applying a potential to the electrodes.

20. The method of claim 19, wherein plating comprises electroless plating.

21. The method of claim 6, wherein forming further comprises selectively functionalizing and coupling nano-materials to the semiconductor device being formed by providing nano-materials of varied lengths and dimensions.

22. The method of claim 1, wherein detaching further comprises applying a potential to the electrode array.

23. The method of claim 1, wherein disposing the semiconductor device on the substrate further comprises functionalizing connection points on the substrate.

24. The method of claim 1, wherein the array of electrodes comprises an approximately isoplanar array of electrodes.

* * * * *